(12) United States Patent
Ie et al.

(10) Patent No.: US 12,503,765 B2
(45) Date of Patent: Dec. 23, 2025

(54) BATCH TYPE SUBSTRATE PROCESSING APPARATUS AND METHOD OF MANUFACTURING SEMICONDUCTOR DEVICE USING THE SAME

(71) Applicant: Samsung Electronics Co., Ltd., Suwon-si (KR)

(72) Inventors: Sangyub Ie, Hwaseong-si (KR); Hyungjoon Kim, Yongin-si (KR); Minju Lee, Hwaseong-si (KR); Eunyeoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 748 days.

(21) Appl. No.: 17/826,901

(22) Filed: May 27, 2022

(65) Prior Publication Data
US 2023/0054580 A1    Feb. 23, 2023

(30) Foreign Application Priority Data

Aug. 17, 2021   (KR) .......................... 10-2021-0108211

(51) Int. Cl.
*C23C 16/455*    (2006.01)
*H01L 21/02*    (2006.01)

(52) U.S. Cl.
CPC .. *C23C 16/45544* (2013.01); *C23C 16/45578* (2013.01); *H01L 21/0228* (2013.01)

(58) Field of Classification Search
CPC ........... H01L 21/0228; C23C 16/45544; C23C 16/45578

USPC ........................................................ 118/715
See application file for complete search history.

(56) References Cited

U.S. PATENT DOCUMENTS

| | | | |
|---|---|---|---|
| 4,184,638 A * | 1/1980 | Ogasawara | ............. B05B 1/005 |
| | | | 181/247 |
| 6,648,034 B1 * | 11/2003 | Birtcher | .................... B08B 9/00 |
| | | | 141/47 |
| 6,758,909 B2 | 7/2004 | Jonnalagadda et al. | |
| 6,955,725 B2 | 10/2005 | Dando | |
| 8,420,167 B2 | 4/2013 | Nakashima et al. | |
| 9,779,917 B2 | 10/2017 | Detmar et al. | |

(Continued)

*Primary Examiner* — Charlee J. C. Bennett
(74) *Attorney, Agent, or Firm* — Muir Patent Law, PLLC

(57) ABSTRACT

A substrate processing apparatus and a method of manufacturing a semiconductor device are provided. The substrate processing apparatus includes a processing chamber; a boat configured to stack substrates; a gas nozzle including a nozzle region and a fastening region; a gas inlet including an insert portion; and an adapter coupling the gas inlet and the gas nozzle. The fastening region includes a first lower region; and a second lower region having a protruding portion protruding outwardly from an outer side surface of the first lower region. The adapter includes a lower pedestal; a lower fastening portion on the lower pedestal and contacting at least a lower surface of the protruding portion; a gasket between a portion of the lower pedestal and a portion of the lower fastening portion; an upper fastening portion contacting at least an upper surface of the protruding portion; a hole passing through the lower pedestal, the lower fastening portion, the protruding portion, and the upper fastening portion; and a fastening unit coupling the lower pedestal, the lower fastening portion, the protruding portion, and the upper fastening portion through the hole.

14 Claims, 14 Drawing Sheets

(56) References Cited

U.S. PATENT DOCUMENTS

| | | | |
|---|---|---|---|
| 2004/0217217 A1* | 11/2004 | Han | C23C 16/4558 239/589 |
| 2010/0099300 A1* | 4/2010 | Hsieh | H01R 24/50 439/607.41 |
| 2011/0232568 A1* | 9/2011 | O'Moore | C30B 25/14 118/715 |
| 2012/0315767 A1 | 12/2012 | Sasaki et al. | |
| 2013/0167774 A1 | 7/2013 | Yang et al. | |
| 2014/0227883 A1 | 8/2014 | Zumoto et al. | |
| 2015/0329284 A1* | 11/2015 | Benet | B65D 53/02 220/378 |
| 2018/0087152 A1* | 3/2018 | Yoshida | C23C 16/455 |
| 2019/0093230 A1* | 3/2019 | Fukushima | H01L 21/68771 |
| 2020/0132231 A1* | 4/2020 | Carroll | C12M 37/04 |
| 2021/0023677 A1* | 1/2021 | Miura | C23C 16/45563 |
| 2021/0252544 A1* | 8/2021 | Abe | H01L 21/67017 |
| 2023/0160066 A1* | 5/2023 | Abe | C23C 16/45578 118/715 |

\* cited by examiner

BATCH TYPE SUBSTRATE PROCESSING APPARATUS AND METHOD OF MANUFACTURING SEMICONDUCTOR DEVICE USING THE SAME

CROSS-REFERENCE TO RELATED APPLICATION(S)

This application claims benefit of priority to Korean Patent Application No. 10-2021-0108211 filed on Aug. 17, 2021 in the Korean Intellectual Property Office, the disclosure of which is incorporated herein by reference in its entirety.

BACKGROUND

The present inventive concept relates to a substrate processing apparatus and a method of manufacturing a semiconductor device using the same.

Semiconductor processes for manufacturing a semiconductor device include a deposition process, a photolithography process, an etching process, and the like, and these semiconductor processes may be performed using various substrate processing apparatuses. Batch type substrate processing apparatuses are being used in some deposition processes to increase productivity.

SUMMARY

An aspect of the present inventive concept is to provide a substrate processing apparatus for increasing productivity.

An aspect of the present inventive concept is to provide a batch type substrate processing apparatus for performing a deposition process using a corrosive gas.

An aspect of the present inventive concept is to provide a method of manufacturing a semiconductor device using the substrate processing apparatus.

According to an aspect of the present inventive concept, a substrate processing apparatus includes a processing chamber; a boat configured to stack a plurality of substrates spaced apart from each other in a vertical direction, and to move into the processing chamber by vertical driving; a gas nozzle including a nozzle region disposed in the processing chamber, the nozzle region including gas injection holes disposed in a portion of the gas nozzle facing toward the center of the processing chamber and toward where the boat is configured to be located, and a fastening region disposed below the nozzle region; a gas inlet including an insert portion inserted into a gas passage in the fastening region; and an adapter coupling the gas inlet and the gas nozzle. The fastening region includes: a first lower region; and a second lower region disposed on the first lower region and having a protruding portion protruding outwardly from an outer side surface of the first lower region The adapter includes: a lower pedestal; a lower fastening portion disposed on the lower pedestal and contacting at least a lower surface of the protruding portion; a gasket disposed between a portion of the lower pedestal and a portion of the lower fastening portion; an upper fastening portion contacting at least an upper surface of the protruding portion; a hole passing through the lower pedestal, the lower fastening portion, the protruding portion, and the upper fastening portion; and a fastening unit coupling the lower pedestal, the lower fastening portion, the protruding portion, and the upper fastening portion through the hole.

According to an aspect of the present inventive concept, a substrate processing apparatus includes a processing chamber; a boat configured to stacka-stack a plurality of substrates to be spaced apart from each other in a vertical direction, and configured to be moved into the processing chamber by vertical driving; and a plurality of gas supply units extending into the processing chamber from an outside of the processing chamber The plurality of gas supply units includes a first gas supply unit and a second gas supply unit. The first gas supply unit includes a first gas inlet extending into the processing chamber from the outside of the processing chamber and having a shape including a horizontal portion and a vertical portion, a first gas nozzle on the first gas inlet, and a first adapter connecting the first gas inlet and the first gas nozzle, and the second gas supply unit includes a second gas inlet extending into the processing chamber from the outside of the processing chamber and having a shape including a horizontal portion and a vertical portion, a second gas nozzle on the second gas inlet, and a second adapter connecting the second gas inlet and the second gas nozzle. A diameter of the first gas inlet is greater than a diameter of the second gas inlet, and the first adapter and the second adapter have different structures from each other.

According to an aspect of the present inventive concept, a substrate processing apparatus includes a processing chamber; a boat configured to stack a plurality of substrates to be spaced apart from each other in a vertical direction, and configured to be moved into the processing chamber by vertical driving; and a plurality of gas supply units extending into the processing chamber from an outside of the processing chamber The plurality of gas supply units includes a first gas supply unit and a second gas supply unit. The first gas supply unit includes a first gas inlet extending into the processing chamber from the outside of the processing chamber and having a shape including a horizontal portion and a vertical portion, a first gas nozzle on the first gas inlet, and a first adapter connecting the first gas inlet and the first gas nozzle, and the second gas supply unit includes a second gas inlet extending into the processing chamber from the outside of the processing chamber and having a shape including a horizontal portion and a vertical portion, a second gas nozzle on the second gas inlet, and a second adapter connecting the second gas inlet and the second gas nozzle. A diameter of the first gas inlet is greater than a diameter of the second gas inlet, and the first adapter and the second adapter have different structures from each other.

According to an aspect of the present inventive concept, a method of manufacturing a semiconductor device includes performing a first semiconductor process on a plurality of substrates to form a first structure on each of the plurality of substrates; loading the plurality of substrates on which the first semiconductor process has been performed into a batch type substrate processing apparatus including a plurality of gas supply units; performing a second semiconductor process in which processes are repeatedly performed using the plurality of gas supply units, to form a second structure on each of the plurality of substrates; unloading the plurality of substrates on which the second semiconductor process has been performed from the batch type substrate processing apparatus; and performing a third semiconductor process on the plurality of substrates on which the second semiconductor process has been performed. The batch type substrate processing apparatus includes a processing chamber and a boat used to stack the plurality of substrates in a manner spaced apart from each other in a vertical direction, wherein the boat is moved into the processing chamber by vertical driving. The plurality of gas supply units extend into the processing chamber from an outside of the processing chamber, and the plurality of gas supply units includes a first gas supply unit and a second gas supply unit. The first gas supply unit includes a first gas inlet extending into the processing chamber from the outside of the processing chamber and having a shape including a horizontal portion and a vertical portion, a first gas nozzle on the first gas inlet, and a first adapter connecting the first gas inlet and the first gas nozzle, The first gas nozzle includes a first nozzle region disposed in the processing chamber and including first gas injection holes disposed to inject gas in a direction from outside of the processing chamber toward the boat, and a first fastening region disposed below the first nozzle region The first fastening region includes a first region, and a second region disposed on the first region and having a protruding portion protruding outwardly from an outer side surface of the first region. The first adapter includes a lower pedestal, a lower fastening portion disposed on the lower pedestal and contacting at least a lower surface of the protruding portion, a gasket disposed between a portion of the lower pedestal and a portion of the lower fastening portion, an upper fastening portion contacting at least an upper surface of the protruding portion, a hole passing through the lower pedestal, the lower fastening portion, the protruding portion, and the upper fastening portion, and a fastening unit coupling the lower pedestal, the lower fastening portion, the protruding portion, and the upper fastening portion through the hole. The performing a second semiconductor process includes injecting a first process gas including a corrosive gas toward the plurality of substrates loaded into the processing chamber through the first gas nozzle of the first gas supply unit.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
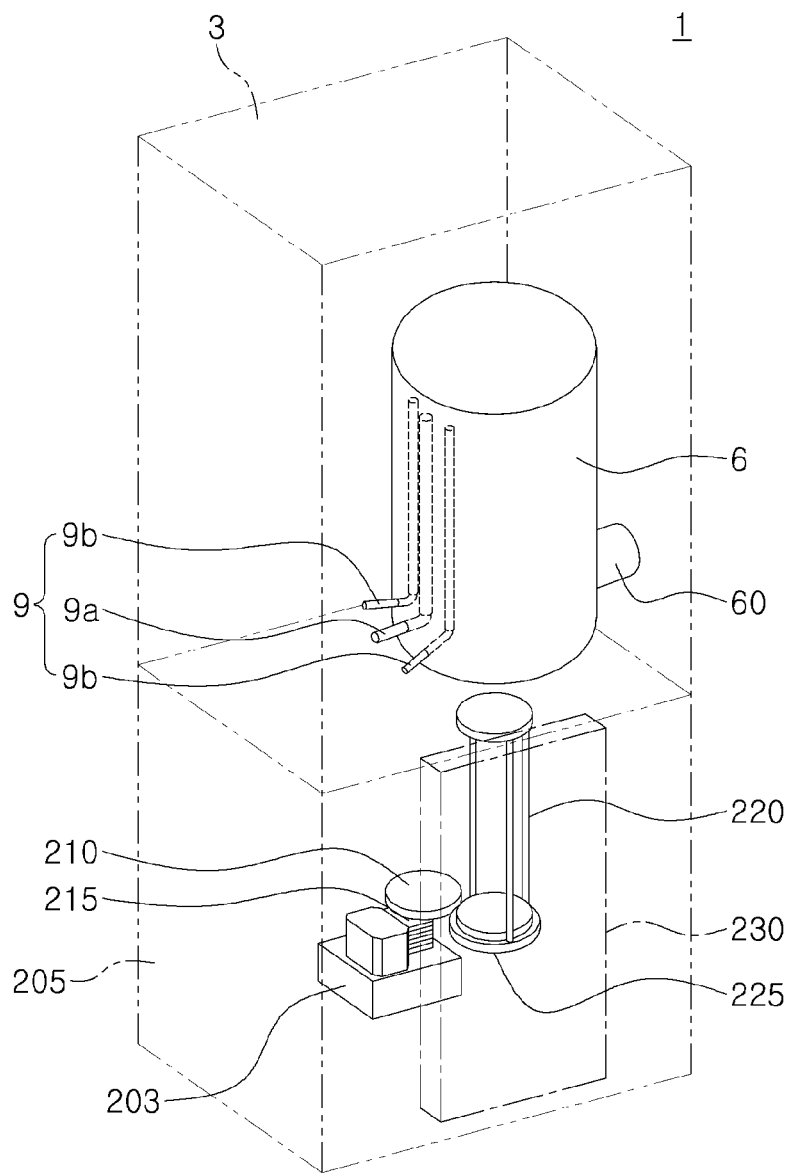
FIG. 1 is a conceptual perspective view illustrating a substrate processing apparatus according to an embodiment of the present inventive concept.

First, an example of a substrate processing apparatus according to an embodiment of the present inventive concept will be described with reference to FIG. 1. FIG. 1 is a conceptual perspective view illustrating a substrate processing apparatus according to an embodiment of the present inventive concept.

Referring to FIG. 1, a substrate processing apparatus 1 may include a housing 3, a processing chamber 6 in the housing 3, a plurality of gas supply units 9 extending into the processing chamber 6 from an outside of the processing chamber 6, and an exhaust port 60 disposed on one side of the processing chamber 6.

The substrate processing apparatus 1 may include a subhousing 205 below the housing 3, a wafer transfer mechanism 203 in the subhousing 205 and including a substrate loading plate 215 on which a plurality of substrates 210 are loaded, a boat 220 vertically movable in the subhousing 205, and a boat elevator 230 vertically moving the boat 220.

The wafer transfer mechanism 203 may load and unload a substrate 210 onto and from the boat 220. For example, the plurality of substrates 210 loaded in the wafer transfer mechanism 203 may be vertically stacked on the boat 220 to be spaced apart from each other.

The boat 220 on which the plurality of substrates 210 are stacked by the wafer transfer mechanism 203 may be moved into the processing chamber 6 by the boat elevator 230.

The plurality of gas supply units 9 may include a first gas supply unit 9a and a second gas supply unit 9b, supplying different types of process gases.

In embodiments, the 'gas supply unit' refers to a unit for supplying a process gas into the processing chamber, and may be replaced with another term, for example, a 'gas supply line,' or the like.

Hereinafter, examples of the plurality of gas supply units 9 will be described.

Figure 2:
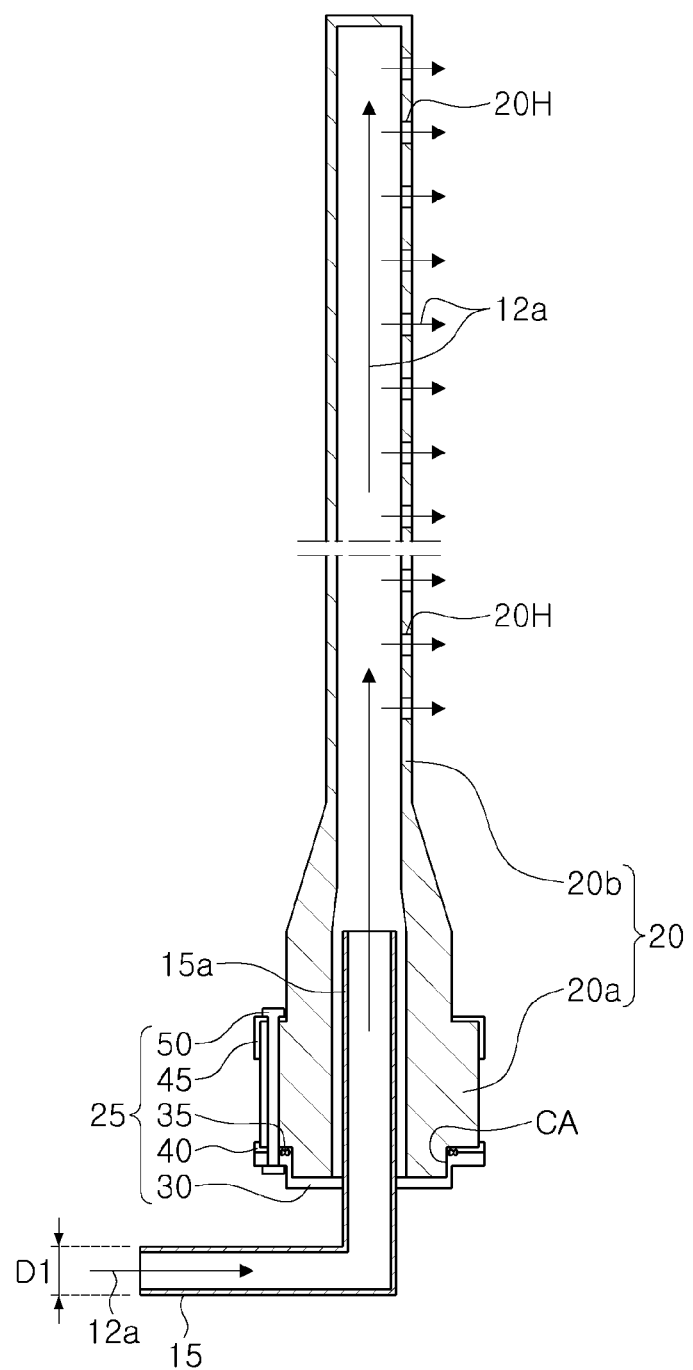
FIG. 2 is a schematic cross-sectional view illustrating a first gas supply unit of a substrate processing apparatus according to an embodiment of the present inventive concept.
Figure 3A:
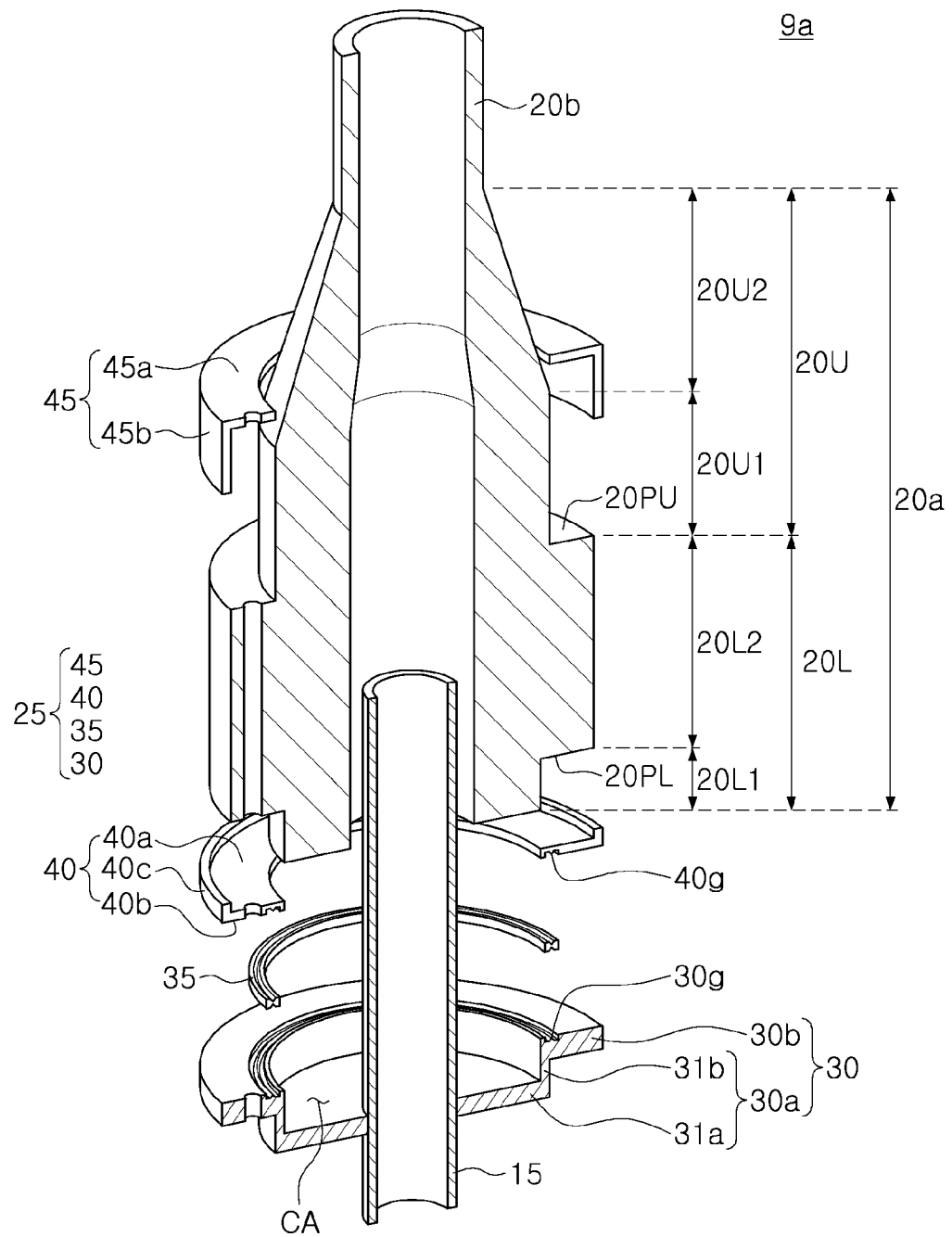
FIG. 3A is an exploded perspective view illustrating a first gas supply unit of a substrate processing apparatus according to an embodiment of the present inventive concept.
Figure 3B:
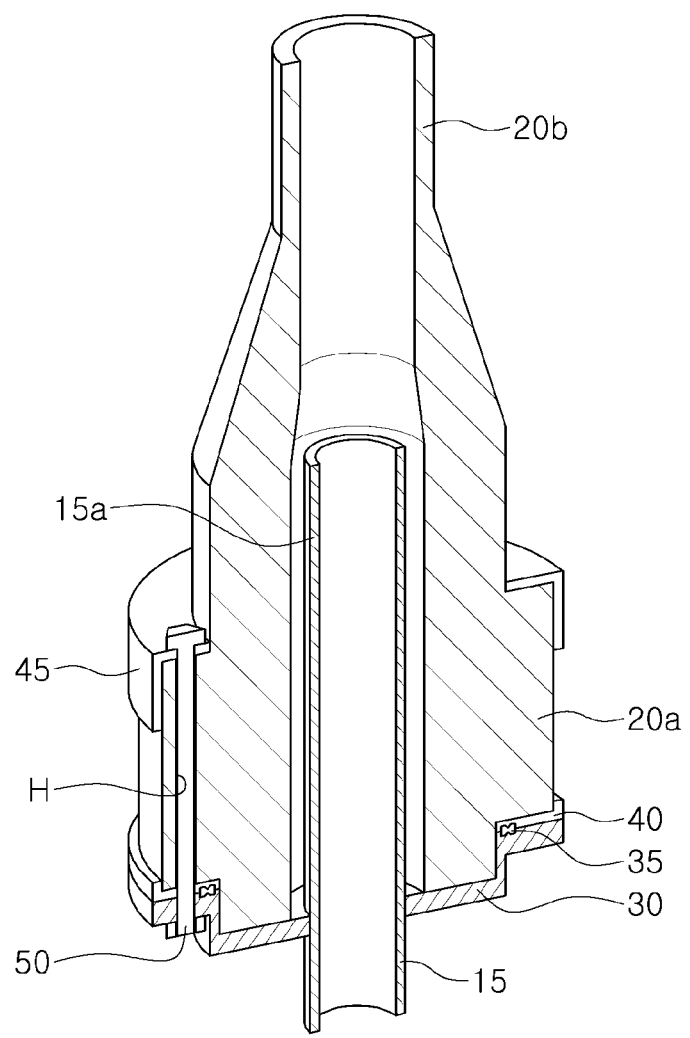
FIG. 3B is a perspective view illustrating a first gas supply unit of a substrate processing apparatus according to an embodiment of the present inventive concept.

First, an example of the first gas supply unit 9a will be described with reference to FIGS. 2, 3A, and 3B. In FIGS. 2, 3A, and 3B, FIG. 2 is a schematic cross-sectional view illustrating a first gas supply unit of a substrate processing apparatus according to an embodiment of the present inventive concept, FIG. 3A is an exploded perspective view of a cross-section cut vertically, for illustrating a first gas supply unit of a substrate processing apparatus according to an embodiment of the present inventive concept, and FIG. 3B is a partial perspective view illustrating a state in which components of the exploded perspective view of FIG. 3A are combined.

Referring to FIGS. 2, 3A, and 3B, a first gas supply unit 9a may include a first gas inlet 15 extending into a processing chamber 6 (refer to FIG. 1) from an outside of the processing chamber 6 and having an "L" shape (e.g., a shape having a horizontal portion and a vertical portion), a first gas nozzle 20 on the first gas inlet 15, and a first adapter 25 connecting the first gas inlet 15 and the first gas nozzle 20.

The first gas nozzle 20 may include a first fastening region 20a, and a first nozzle region 20b on the first fastening region 20a and including first gas injection holes 20H.

The first fastening region 20a may include a lower region 20L and an upper region 20U on the lower region 20L.

In the first fastening region 20a, the lower region 20L may include a first lower region 20L1, and a second lower region 20L2 disposed on the first lower region 20L1 and having protruding portion (20PL and 20PU) protruding outwardly from an outer side surface of the first lower region 20L1. In the second lower region 20L2, the protruding portion may have a lower surface 20PL and an upper surface 20PU.

In the first fastening region 20a, the upper region 20U may include a first upper region 20U1 and a second upper region 20U2 on the first upper region 20U1. The first upper region 20U1 may have a substantially vertical outer side surface, and the second upper region 20U2 may have an inclined outer side surface extending from the outer side surface of the first upper region to gradually decrease in width (e.g., horizontal width, or diameter). The protruding portion (20PL and 20PU) of the second lower region 20L2 may protrude outwardly from the outer side surface of the first upper region 20U1. Terms such as "same," "equal," "planar," "coplanar," "vertical," "horizontal," "flat," "parallel," and "perpendicular," as used herein encompass identicality or near identicality including variations that may occur, for example, due to manufacturing processes. The term "substantially" may be used herein to emphasize this meaning, unless the context or other statements indicate otherwise.

The first adapter 25 may include a lower pedestal 30 disposed below the first fastening region 20a and coupled to the first gas inlet 15; a lower fastening portion 40 disposed on the lower pedestal 30 and contacting at least the lower surface 20PL of the protruding portion (20PL and 20PU); a gasket 35 disposed between a portion of the lower pedestal 30 and a portion of the lower fastening portion 40; an upper fastening portion 45 contacting at least the upper surface 20PU of the protruding portion (20PL and 20PU); a hole H (refer to FIG. 3B) passing through the lower pedestal 30, the lower fastening portion 40, the protruding portion (20PL and 20PU), and the upper fastening portion 45; and a fastening unit 50 (refer to FIG. 3B) coupling the lower pedestal 30, the lower fastening portion 40, the protruding portion (20PL and 20PU), and the upper fastening portion 45 through the hole H.

The lower pedestal 30 may include a first pedestal 30a and a second pedestal 30b.

The first pedestal 30a may include a pedestal portion 31a, also described as a first pedestal platform or lower pedestal platform, coupled to the first gas inlet 15, for example, by welding, and an extension portion 31b extending upwardly from the pedestal portion 31a to define a cavity CA.

The second pedestal 30b may be disposed on the extension portion 31b, may protrude outwardly from the first pedestal 30a, and may include a first groove 30g recessed in an upper surface. The second pedestal 30b may also be described as a second pedestal platform or an upper pedestal platform. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The lower fastening portion 40 may include an upper surface 40a contacting the lower surface 20PL of the protruding portion (20PU and 20PL), a lower surface 40b opposite to the upper surface 40a, and a second groove 40g recessed in the lower surface 40b.

The lower fastening portion 40 may further include a side portion 40c, also described as a side wall, covering a portion of a side surface of the protruding portion (20PU and 20PL). The lower fastening portion 40 may be described as a lower cap or a lower fastening cap, having a horizontal plate connected to a sidewall.

The gasket 35 may fill a space between the first groove 30g and the second groove 40g, and may contact the second pedestal 30b and the lower fastening portion 40. The term "contact," as used herein, refers to a direct connection (i.e., touching) unless the context indicates otherwise.

At least a portion of the gasket 35 may have a knife sharpener shape.

The gasket 35 may have a ring shape.

On a height level on which the gasket is located, a distance between the gasket 35 and the first gas inlet 15 may be shorter than a distance between the fastening unit 50 and the first gas inlet 15.

The upper fastening portion 45 may include a first upper fastening portion 45a contacting the upper surface 20PU of the protruding portion (20PU and 20PL), and a second upper fastening portion 45b extending from the first upper fastening portion 45a and contacting a portion of the side surface of the protruding portion (20PU, 20PL). The upper fastening portion 45 may be described as an upper cap or an upper fastening cap, having a horizontal plate connected to a sidewall. The lower fastening portion 40 may be described as an intermediate connecting plate, since it is situated between first gas nozzle 20 and the lower pedestal 30 and it assists in connecting the two.

The fastening unit 50 may include a bolt-nut set including a portion inserted into the hole H. The fastening unit 50 may be described as a connector or fastener, and may include a connecting rod, for example, that is part of a bolt-nut set.

The first gas nozzle 20 may be formed of quartz or a quartz-like material.

The first gas inlet 15 may be formed of a corrosion-resistant metal or a corrosion-resistant metal alloy.

The first adapter 25 may include or be formed of at least one of a corrosion-resistant metal or a corrosion-resistant metal alloy. For example, at least one of the lower pedestal 30, the lower fastening portion 40, or the upper fastening portion 45 may include or be formed of a corrosion-resistant metal alloy. The corrosion-resistant metal alloy may be a Ni-based corrosion-resistant metal alloy. For example, the corrosion-resistant metal alloy may be a trade name 'hastelloy' from Haynes International, Inc., but a material type of the corrosion-resistant metal alloy is not limited thereto.

The gasket 35 may be a material for serving as a vacuum seal while preventing gas leakage. The gasket 35 may include a material having higher ductility and smaller hardness (e.g., a softer material) than a material of the lower pedestal 30 and a material of the lower fastening portion 40. For example, the gasket 35 may include or be formed of a metal, such as at least one of Au, Ni, Au-plated Ni, Ag-plated Ni, Pt, or Pt-plated Ni. The material of the gasket 35 is not limited thereto.

The first gas supply unit 9a may inject a first process gas 12a, introduced into the first gas inlet 15, through the first gas injection holes 20H.

The first gas inlet 15 may include an insertion portion 15a inserted into a gas passage in the first fastening region 20a. The first gas inlet 15 may have a first diameter D1. The first gas supply unit 9a may inject a high flow rate gas. For example, the first gas supply unit 9a may supply a high flow rate gas into the processing chamber 6 without leakage of the gas.

The first process gas 12a may include a corrosive process gas, for example, a Cl-based corrosive gas. The first gas supply unit 9a may supply a high flow rate of corrosive gas into the processing chamber 6 without leakage of the gas. For example, in the first gas supply unit 9a, the first adapter 25 and the first fastening region 20a of the first gas nozzle 20 may supply a high flow rate of corrosive gas into the processing chamber 6 without leakage of the gas.

Figure 4:
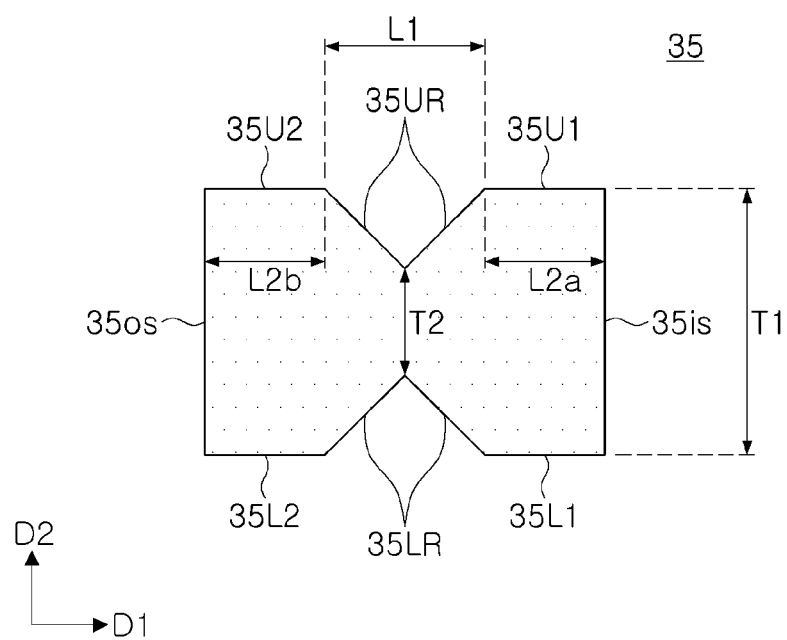
FIG. 4 is a cross-sectional view illustrating a gasket of a substrate processing apparatus according to an embodiment of the present inventive concept.

Next, an example of the gasket 35 will be described with reference to FIG. 4. FIG. 4 is a cross-sectional view illustrating a gasket of a substrate processing apparatus according to an embodiment of the present inventive concept.

Referring to FIG. 4, from a cross-sectional view, at least a portion of a gasket 35 may have a knife sharpener shape. The gasket 35 may have an inner side surface 35is (e.g., facing toward the first gas inlet 15), an outer side surface 35os (e.g., facing away from the first gas inlet 50 and toward an outside of the processing chamber 6), an upper surface (35U1, 35UR, and 35U2, facing toward a top of the processing chamber 6), and a lower surface (35L1, 35LR, and 35L2, facing toward a bottom of the processing chamber 6).

The upper surface (35U1, 35UR, and 35U2) of the gasket 35 may include at least one upper recess 35UR, and may include portions extending horizontally (e.g., in a direction parallel to the upper surface 40a of the lower fastening portion 40), and portions extending at a sloped angle (e.g., in a diagonal direction neither parallel nor perpendicular to the upper surface 40a of the lower fastening portion 40).

The lower surface (35L1, 35LR, and 35L2) of the gasket 35 may include at least one lower recess 35LR, and may include portions extending horizontally (e.g., in a direction parallel to the upper surface 40a of the lower fastening portion 40), and portions extending at a sloped angle (e.g., in a diagonal direction neither parallel nor perpendicular to the upper surface 40a of the lower fastening portion 40).

The at least one upper recess 35UR may have a "V" shape.

The at least one lower recess 35LR may be mirror symmetric with the at least one upper recess 35UR. The gasket 35 may have an hourglass shape, rotated 90 degrees, and may also be described as having a spool shape.

A maximum width of the at least one upper recess 35UR (e.g., L1) in a horizontal direction D1 parallel to the upper surface 40a of the lower fastening portion 40 may be about 0.65 mm to about 1 mm.

A distance from an upper end of the inner side surface 35is to the at least one upper recess 35UR (e.g., L2a) in a horizontal direction D1 parallel to the upper surface 40a of the lower fastening portion 40 may be about 0.3 mm to about 0.5 mm.

A distance from an upper end of the outer side surface 35os to the at least one upper recess 35UR (e.g., L2b) in a horizontal direction D1 parallel to the upper surface 40a of the lower fastening portion 40 may be about 0.3 mm to about 0.5 mm.

A minimum distance between the at least one upper recess 35UR and the at least one lower recess 35LR (e.g., T2) in a vertical direction D2 perpendicular to the upper surface 40a of the lower fastening portion 40 may be about 0.5 mm to about 0.8 mm.

A maximum vertical height (e.g., T1) in a vertical direction D2 perpendicular to the upper surface 40a of the lower fastening portion 40 may be about 1 mm to about 2 mm.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Figure 5:
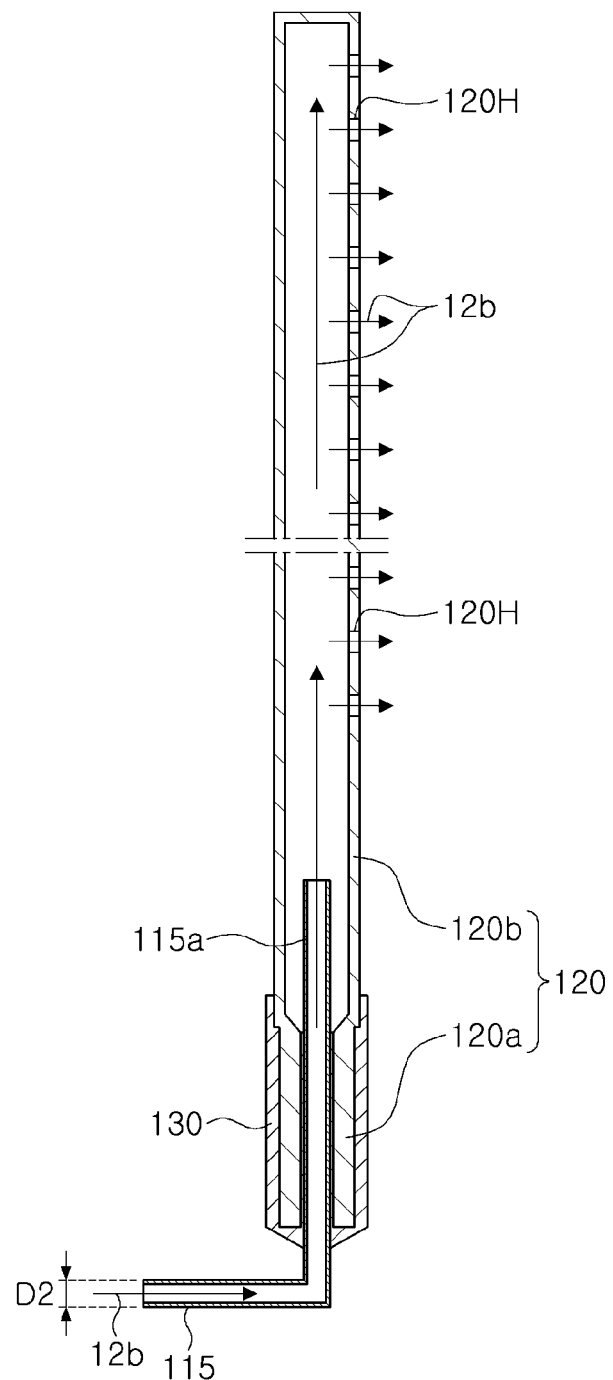
FIG. 5 is a schematic cross-sectional view illustrating a second gas supply unit of a substrate processing apparatus according to an embodiment of the present inventive concept.

Next, an example of a second gas supply unit of a substrate processing apparatus according to an embodiment of the present inventive concept will be described with reference to FIGS. 5 and 6. The second gas supply unit may be one of the second gas supply units 9b of FIG. 1, for example. FIG. 5 is a schematic cross-sectional view illustrating a second gas supply unit of a substrate processing apparatus according to an embodiment of the present inventive concept, and FIG. 6 is an exploded perspective view illustrating a second gas supply unit of a substrate processing apparatus according to an embodiment of the present inventive concept.

Figure 6:
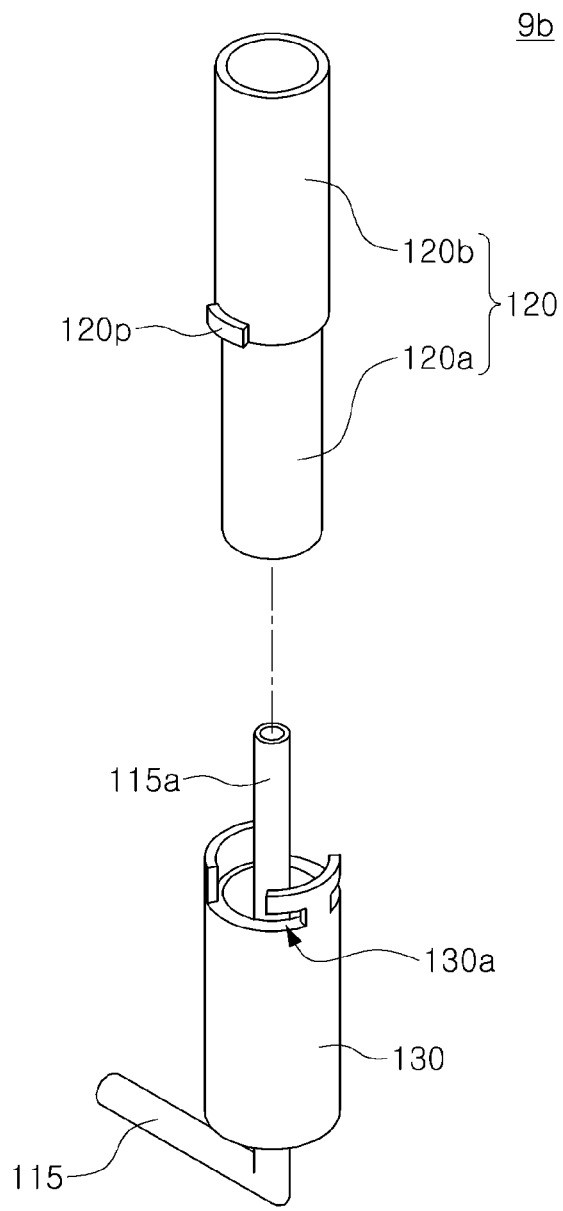
FIG. 6 is an exploded perspective view illustrating a second gas supply unit of a substrate processing apparatus according to an embodiment of the present inventive concept.

Referring to FIGS. 5 and 6, a second gas supply unit 9b may include a second gas inlet 115 extending into a processing chamber 6 (refer to FIG. 1) from an outside of the processing chamber 6 and having an "L" shape (e.g., a shape having a horizontal portion and a vertical portion), a second gas nozzle 120 on the second gas inlet 115, and a second adapter 130 connecting the second gas inlet 115 and the second gas nozzle 120.

The second adapter 130 may have a structure different from that of a first adapter 25 (refer to FIGS. 2, 3A, and 3B).

The first adapter 25 (refer to FIGS. 2, 3A, and 3B) may connect a first gas inlet 15 (refer to FIGS. 2, 3A, and 3B) and a first gas nozzle 20 (refer to FIGS. 2, 3A, and 3B) using 'n' components, and the second adapter 130 may connect the second gas inlet 115 and the second gas nozzle 120 using 'm' components. Each component of the 'm' components and 'n' components may refer to a single, unitary, integrated piece of material. The 'm' may be a natural number, and the 'n' may be a natural number, greater than 'm.' 'n' components of the first adapter 25 (refer to FIGS. 2, 3A, and 3B) may include the lower pedestal 30, the gasket 35, the lower fastening portion 40, the upper fastening portion 45, and the fastening unit 50, described above with reference to FIGS. 2, 3A, and 3B.

The second gas nozzle 120 may include a second nozzle region 120b disposed in the processing chamber 6 (refer to FIG. 1) and including second gas injection holes 120H, and a second fastening region 120a disposed below the second nozzle region 120b.

The second gas inlet 115 may include a second insertion portion 115a inserted into a gas passage in the second fastening region 120a of the second gas nozzle 120.

The second fastening region 120a may include a protruding portion 120p (refer to FIG. 6) disposed on an outside of an upper region of the second fastening region 120a.

The second adapter 130 may include a groove 130a (refer to FIG. 6) coupled to the second gas inlet 115 below the second fastening region 120a by welding, having a cylindrical shape into which the second fastening region 120a is inserted, and coupled to the protruding portion 120p of the second fastening region 120a in the upper region of the second fastening region 120a.

As the protruding portion 120p, also described as a protrusion, is fitted into the groove 130a by horizontal rotation, the second gas nozzle 120 may be fastened with the second adapter 130 coupled to the second gas inlet 115.

The second gas inlet 115 may have a second diameter D2. The second gas supply unit 9b may inject a second process gas 12b, introduced into the second gas inlet 115, through the second gas injection holes 120H.

The second diameter D2 of the second gas inlet 115 may be less than the first diameter D1 of the first gas inlet 15 (refer to FIG. 2). Therefore, the first gas supply unit 9a may inject a high flow rate gas, and the second gas supply unit 9b may inject a low flow rate gas. For example, the second gas supply unit 9b may have a simpler structure than the first gas supply unit 9a, and may supply a low flow rate gas into the processing chamber 6 without leakage of the gas. The second process gas 12b may include a non-corrosive process gas, for example, a non-corrosive purge gas, a non-corrosive source gas, or a non-corrosive reactive gas. For example, the second gas supply unit 9b may supply a low flow rate of a non-corrosive process gas into the processing chamber 6 without leakage of the gas.

Figure 7A:
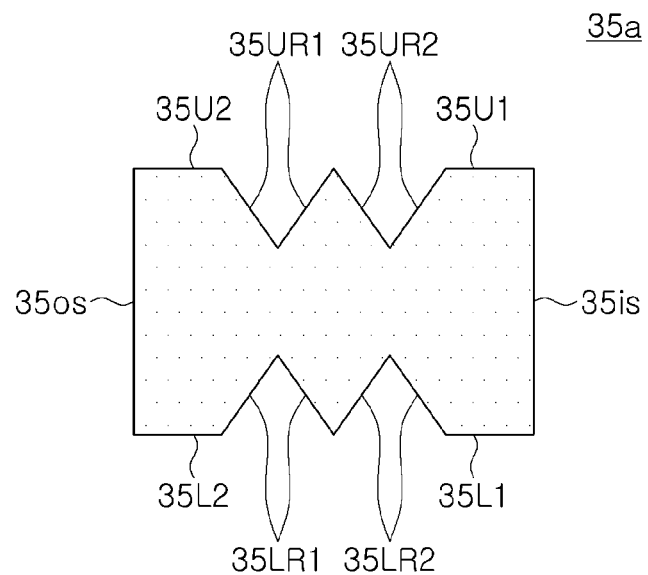
FIG. 7A is a cross-sectional view illustrating a modified example of a gasket of a substrate processing apparatus according to an embodiment of the present inventive concept.
Figure 7B:
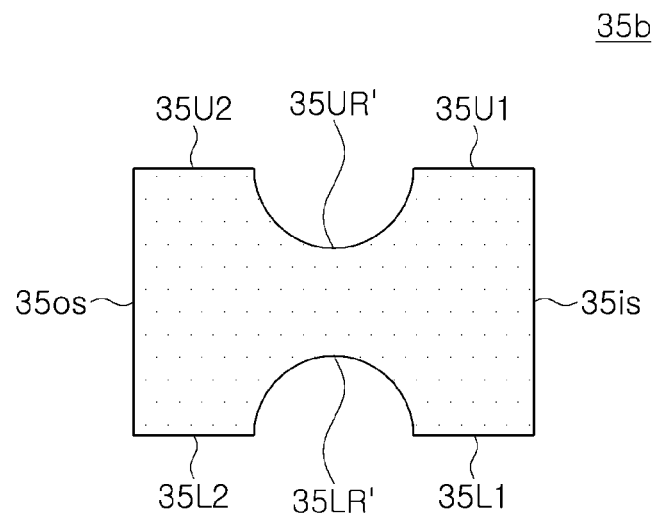
FIG. 7B is a cross-sectional view illustrating another modified example of a gasket of a substrate processing apparatus according to an embodiment of the present inventive concept.

Next, modified examples of a gasket of a substrate processing apparatus according to an embodiment of the present inventive concept will be described with reference to FIGS. 7A and 7B, respectively. FIG. 7A is a cross-sectional view illustrating a modified example of a gasket of a substrate processing apparatus according to an embodiment of the present inventive concept, and FIG. 7B is a cross-sectional view illustrating another modified example of a gasket of a substrate processing apparatus according to an embodiment of the present inventive concept.

In a modified example, referring to FIG. 7A, a gasket 35a may have an inner side surface 35is, an outer side surface 35os, an upper surface (35U1, 35UR1, 35UR2, and 35U2), and a lower surface (35L1, 35LR1, 35LR2, and 35L2). Part of the gasket 35a may be described as having a knife-edge shape.

The upper surface (35U1, 35UR1, 35UR2, and 35U2) of the gasket 35a may include a plurality of upper recesses 35UR1 and 35UR2. Each of the plurality of upper recesses 35UR1 and 35UR2 may have a "V" shape. When the number of plurality of upper recesses 35UR1 and 35UR2 is two, the plurality of upper recesses 35UR1 and 35UR2 may form a W shape.

The lower surface (35L1, 35LR1, 35LR2, and 35L2) of the gasket 35a may include a plurality of lower recesses 35LR1 and 35LR2.

The plurality of lower recesses 35LR1 and 35LR2 may be mirror symmetric with the plurality of upper recesses 35UR1 and 35UR2, respectively. The first groove 30g of the lower pedestal 30 and the second groove 40g of the lower fastening portion 40 may have shapes that match the shapes of the surfaces of the modified gasket 35a.

In a modified example, referring to FIG. 7B, in a gasket 35b, the at least one upper recess 35UR having a "V" shape, described in FIG. 4, may be transformed into at least one upper recess 35UR' having a "U" shape. In the gasket 35b, the at least one lower recess 35LR having a "V" shape, described in FIG. 4, may be transformed into at least one lower recess 35LR' having a "U" shape. In this case, the gasket 35b may still have a spool shape, though modified from the spool shape of the gasket 35 of FIG. 4. It should be noted that all of the example gaskets 35, 35a, and 35b include a full-height portions on either end in a horizontal direction, and at least one recess at an inside portion in the horizontal direction.

Figure 8A:
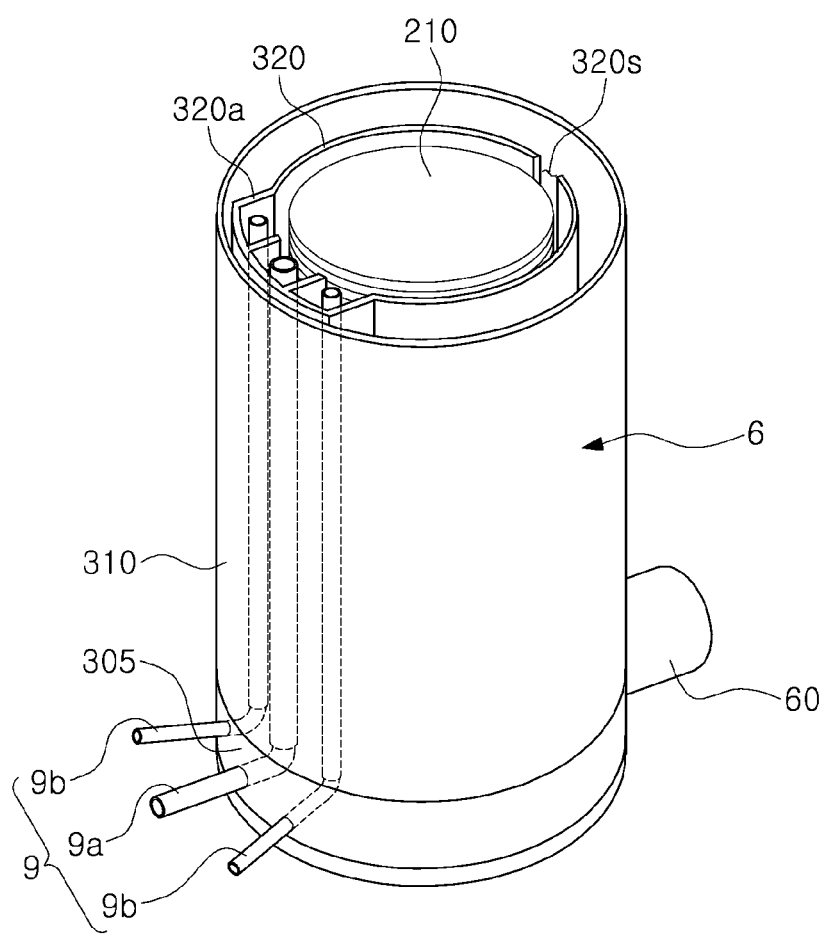
FIG. 8A is a conceptual perspective view illustrating an example of a substrate processing apparatus according to an embodiment of the present inventive concept.

Next, an example of a processing chamber of a substrate processing apparatus according to an embodiment of the present inventive concept will be described with reference to FIGS. 8A and 8B. FIG. 8A is a conceptual perspective view illustrating an example of a substrate processing apparatus according to an embodiment of the present inventive concept, and FIG. 8B is a conceptual perspective view illustrating a portion of a substrate processing apparatus according to an embodiment of the present inventive concept.

Figure 8B:
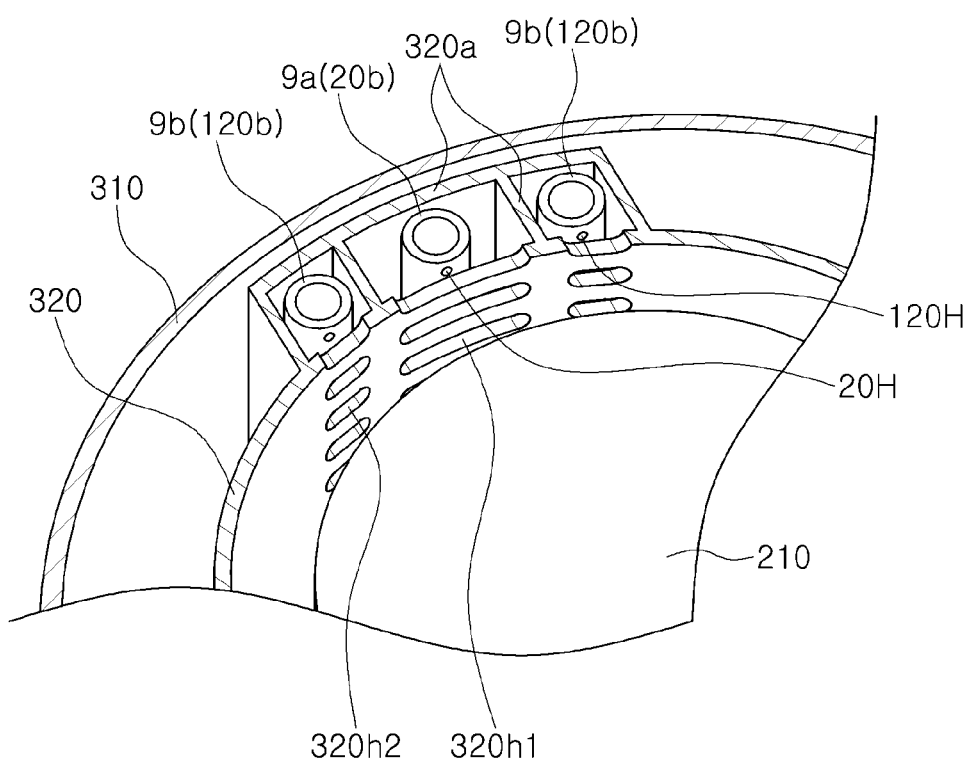
FIG. 8B is a conceptual perspective view illustrating a portion of a substrate processing apparatus according to an embodiment of the present inventive concept.

Referring to FIGS. 8A and 8B, a processing chamber 6, as described in FIG. 1, may include a manifold 305 and at least one tube (310 or 320) disposed on the manifold 305.

The at least one tube (310 or 320) may include an inner tube 320 and an outer tube 310 surrounding an outside of the inner tube 320.

A plurality of gas supply units 9 may be inserted into the processing chamber 6 through the manifold 305 from an outside of the processing chamber 6, and may extend into the inner tube 320.

A plurality of substrates 210 (refer to FIG. 1) vertically loaded on a boat 220 (refer to FIG. 1) moved into the processing chamber 6 by a boat elevator 230 (refer to FIG. 1), as described in FIG. 1, may be located on an inside of the inner tube 320.

In an embodiment, the inner tube 320 may be provided with and attached to at least one buffer region 320a, also described as a protruding region, in which gas nozzles 20b and 120b of the plurality of gas supply units 9 may be located. The buffer region 320a may include first and second slits 320h1 and 320h2 formed between the gas supply units 9 and the plurality of substrates 210 in a radial direction with respect to the plurality of substrates 210.

The first gas injection holes 20H of a first gas nozzle 20 may be disposed in positions facing the first slits 320h1, and second gas injection holes 120H of a second gas nozzle 120 may be disposed in positions facing the second slits 320h2.

In another embodiment, the at least one buffer region 320a may be omitted. When the at least one buffer region 320a is omitted, the gas nozzles 20 and 120 may be disposed inside the inner tube 320.

The inner tube 320 may include an exhaust slit 320s. As described above, a first process gas 12a (refer to FIG. 2) and a second process gas 12b (refer to FIG. 5) may be injected from the first gas injection holes 20H and the second gas injection holes 120H, respectively, to perform a semiconductor process on the plurality of substrates 210, and after the semiconductor process is performed, the first process gas 12a (refer to FIG. 2) and the second process gas 12b (refer to FIG. 5) may be discharged through the exhaust slit 320s and an exhaust port 60 (refer to FIG. 1) disposed on at least one side of the processing chamber 6.

Figure 9A:
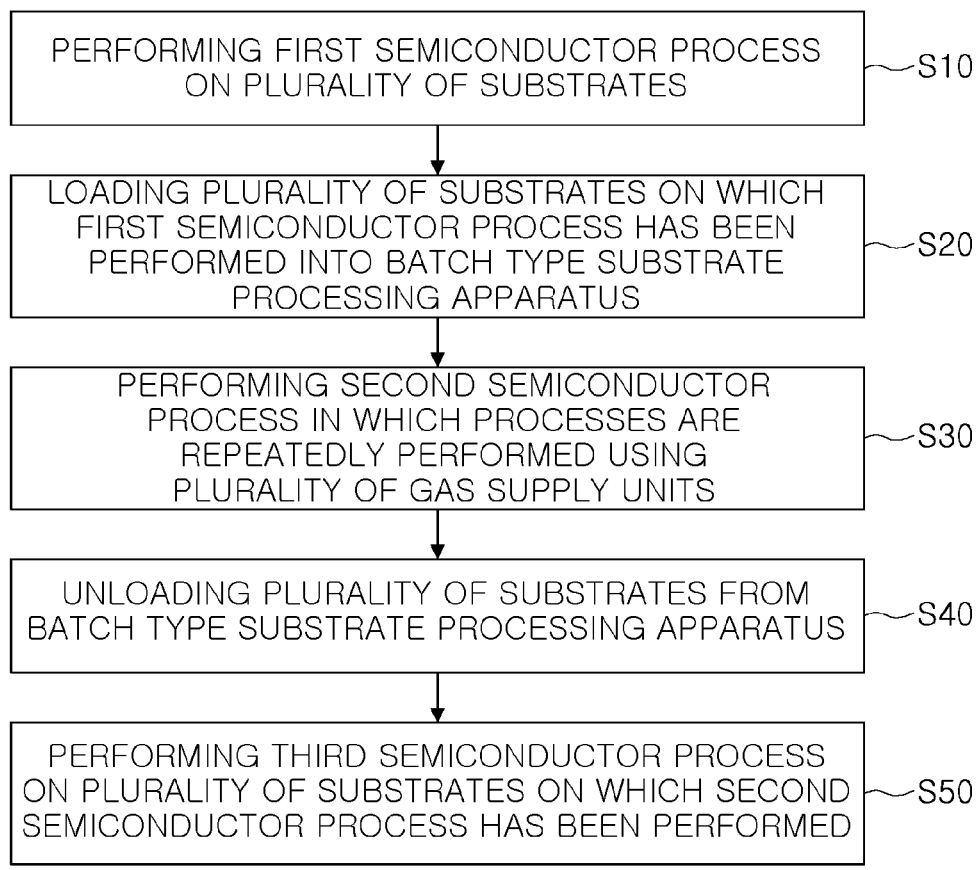
FIGS. 9A and 9B are process flowcharts illustrating a method of manufacturing a semiconductor device using a substrate processing apparatus according to an embodiment of the present inventive concept.
Figure 9B:
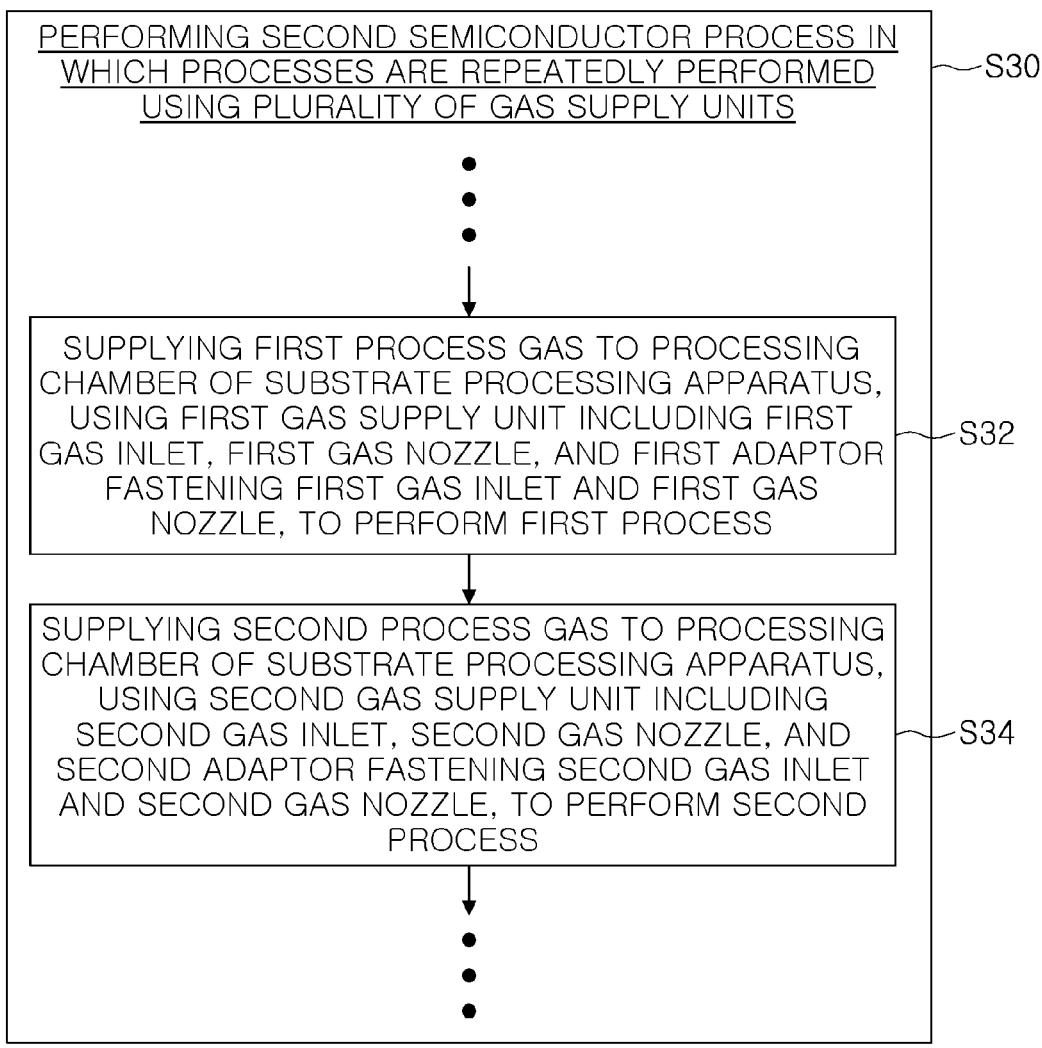

Next, a method of manufacturing a semiconductor device using a substrate processing apparatus according to an embodiment of the present inventive concept will be described. FIGS. 9A and 9B are process flowcharts illustrating a method of manufacturing a semiconductor device using a substrate processing apparatus according to an embodiment of the present inventive concept, and FIGS. 10 to 13 are cross-sectional views illustrating a method of manufacturing a semiconductor device using a substrate processing apparatus according to an embodiment of the present inventive concept.

Figure 10:
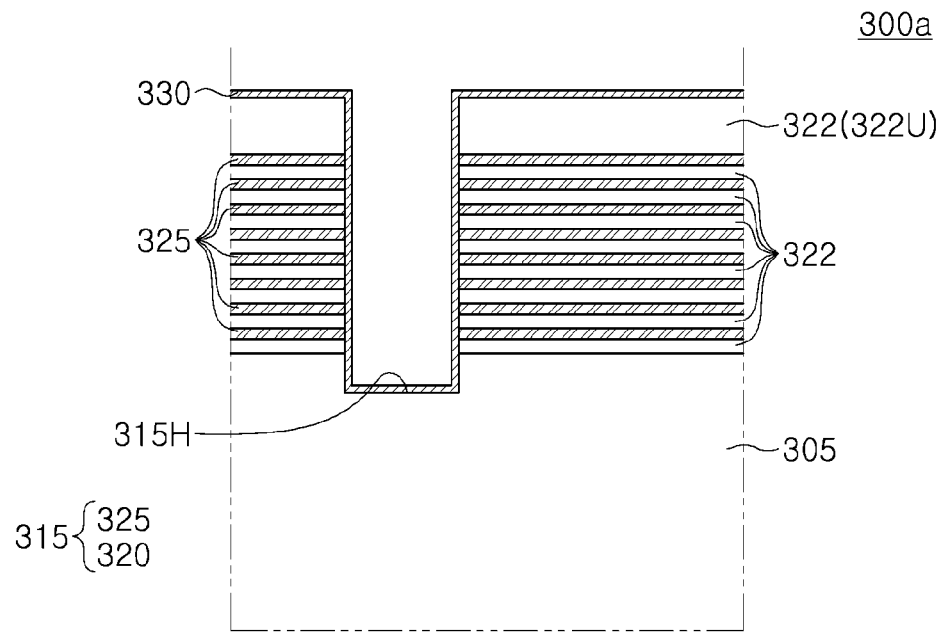
FIGS. 10 to 13 are cross-sectional views illustrating a method of manufacturing a semiconductor device using a substrate processing apparatus according to an embodiment of the present inventive concept.

Referring to FIGS. 9A and 10, a first semiconductor process may be performed on a plurality of substrates 305 (S10). The first semiconductor process may be performed to form a first structure on each of the plurality of substrates. For example, the formation of the first structure on each of the plurality of substrates may include sequentially forming a mold structure 315 including interlayer insulating layers 322 and gate layers 325, alternately stacked on the plurality of substrates 305, a channel hole 315H passing through the mold structure 315, and a channel layer 330 covering at least an inner wall of the channel hole 315H. In the interlayer insulating layers 322, an uppermost interlayer insulating layer 322U may be thicker than each of the other interlayer insulating layers.

Therefore, a plurality of substrates 300a on which the first semiconductor process has been performed may be formed. The channel layer 330 may be conformally formed as a silicon layer.

The interlayer insulating layers 322 may be formed of silicon oxide, and the gate layers 325 may be formed of silicon nitride. The gate layers 325 may be referred to as a mold layer or a sacrificial gate layer.

Figure 11:
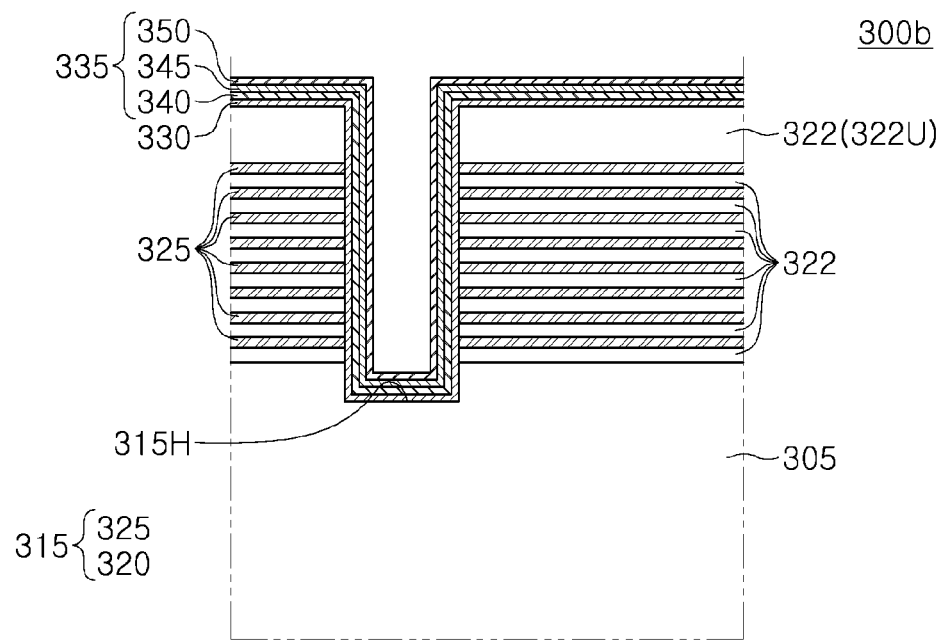

Referring to FIGS. 9A, 9B, and 11, the plurality of substrates 300a on which the first semiconductor process has been performed may be loaded into a batch type substrate processing apparatus including a plurality of gas supply units 9 (refer to FIGS. 1, 8A, and 8B) (S20). The batch type substrate processing apparatus may be a substrate processing apparatus according to any one of the embodiments described with reference to FIGS. 1 to 8B. For example, S20 may include transferring the plurality of substrates 300a on which the first semiconductor process has been performed into a subhousing 205 (refer to FIG. 1), a substrate loading plate 215 of a wafer transfer mechanism 203 (refer to FIG. 1), vertically loading the plurality of substrates 300a loaded on the wafer transfer mechanism 203 (refer to FIG. 1) on the boat 220, and moving the boat 220 into the processing chamber 6 (refer to FIGS. 1, 8A, and 8B) using the boat elevator 230. A lower portion of the processing chamber 6 (refer to FIGS. 1, 8A, and 8B) may be blocked by a seal cap 225 (refer to FIG. 1) below the boat 220.

A second semiconductor process in which processes are repeatedly performed may be performed using the plurality of gas supply units 9 (S30). A second structure may be formed on each of the plurality of substrates 300a by the second semiconductor process. Therefore, a plurality of substrates 300b on which the second semiconductor process has been performed may be formed.

The formation of the second structure on each of the plurality of substrates 300a may include sequentially forming a plurality of layers 335 on the channel layer 330. The plurality of layers 335 may include a first oxide layer 340, an information storage layer 345, and a second oxide layer 350, sequentially formed. The first oxide layer 340 may be formed of silicon oxide or nitrogen-doped silicon oxide, and the information storage layer 345 may be formed of a material for storing information by trapping a charge, for example, silicon nitride, and the second oxide layer 350 may be formed of silicon oxide.

The second semiconductor process may include injecting a first process gas 12a (refer to FIG. 2) containing a corrosive gas to the plurality of substrates 300a (refer to FIG. 10) loaded into a processing chamber 6 (refer to FIGS. 1, 8A, and 8B), through a first gas nozzle 20 (refer to FIG. 2) of a first gas supply unit 9a (refer to FIG. 2). A type of the first process gas 12a (refer to FIG. 2) may vary according to types of materials of the plurality of layers 335. For example, the second semiconductor process may include supplying a first process gas 12a (refer to FIG. 2) to a processing chamber 6 (refer to FIGS. 1, 8A, and 8B) of a substrate processing apparatus, using a first gas supply unit 9a (refer to FIGS. 2, 3A, and 3B) including a first gas inlet 15, a first gas nozzle 20, and a first adaptor 25 connecting the first gas inlet 15 and the first gas nozzle 20, to perform a first process (S32).

The second semiconductor process may further include injecting a second process gas 12b (refer to FIG. 5) containing a non-corrosive gas to the plurality of substrates 300a (refer to FIG. 10) loaded into a processing chamber 6 (refer to FIGS. 1, 8A, and 8B), through a second gas nozzle 120 (refer to FIG. 5) of a second gas supply unit 9b (refer to FIG. 5). The second process gas 12b (refer to FIG. 5) may include a purge gas such as nitrogen or the like. For example, the second semiconductor process may include supplying a second process gas 12b (refer to FIG. 5) to a processing chamber 6 (refer to FIGS. 1, 8A, and 8B) of a substrate processing apparatus, using a second gas supply unit 9b (refer to FIGS. 5 and 6) including a second gas inlet 115, a second gas nozzle 120, and a second adaptor 130 connecting the second gas inlet 115 and the second gas nozzle 120, to perform a second process (S34).

The second semiconductor process may include repeating the first process of S32 and the second process of S34 to form the plurality of layers 335.

The plurality of substrates 300b on which the second semiconductor process has been performed may be unloaded from the batch type substrate processing apparatus (S40).

Figure 12:
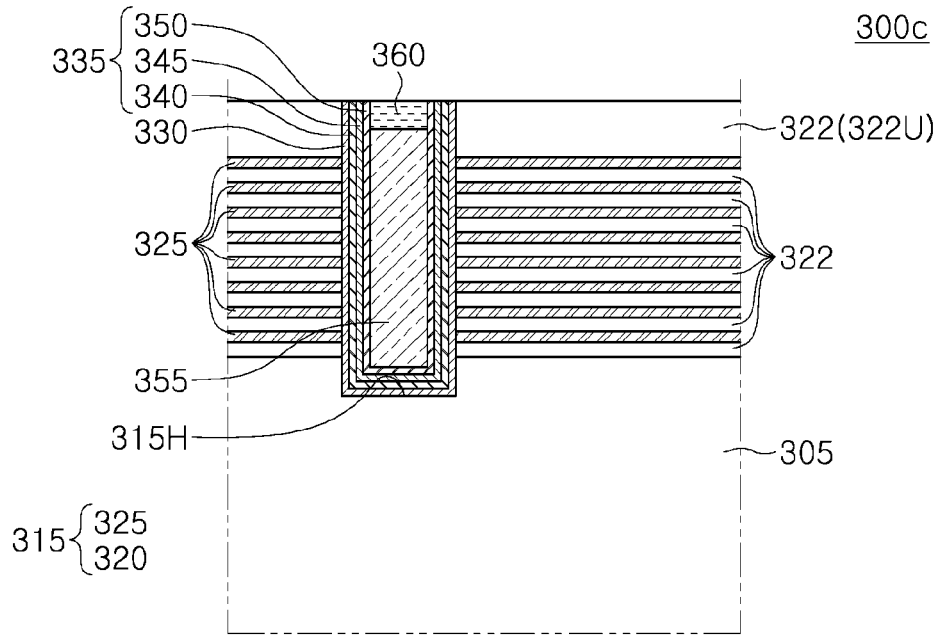
Figure 13:
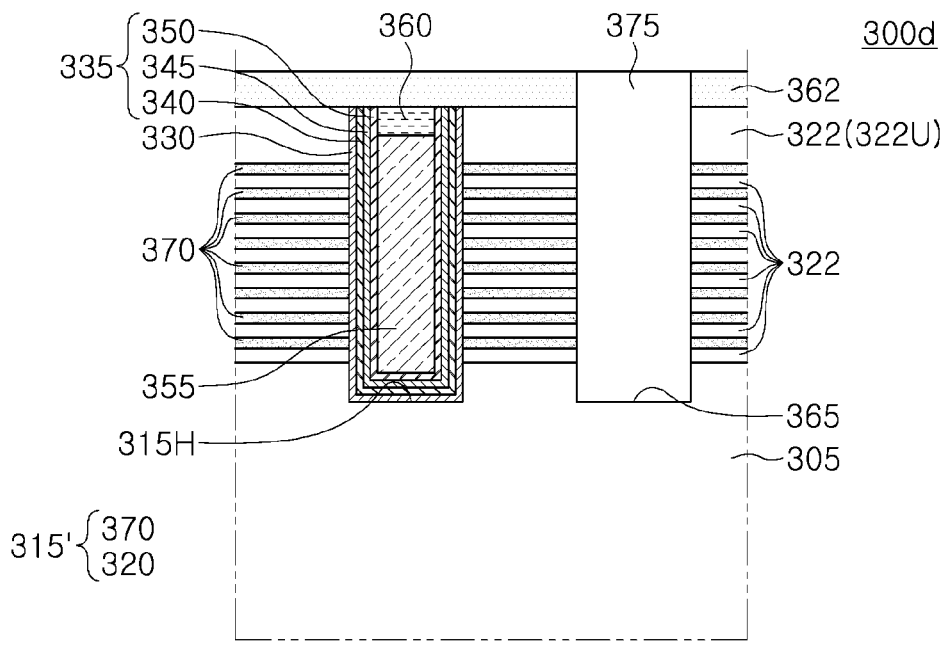

Referring to FIGS. 9A, 12, and 13, a third semiconductor process may be performed on the plurality of substrates 300b (refer to FIG. 11) on which the second semiconductor process has been performed (S50).

The third semiconductor process, performed on the plurality of substrates 300b (refer to FIG. 11) on which the second semiconductor process has been performed, may include forming a gap-fill insulating layer 355 partially filling the channel hole 315H on the plurality of layers 335, forming a pad layer 360 on the gap-fill insulating layer 355, planarizing the pad layer 360 and the plurality of layers 335 until an upper surface of the mold structure 315 is exposed, forming an insulating layer 362 on the mold structure 315, forming a separation trench 365 passing through the insulating layer 362 and the mold structure 315, removing the gate layers 325 (refer to FIG. 12) of the mold structure 315 exposed by the separation trench 365 to form empty spaces, forming gate electrodes 370 in the empty spaces, and forming a separation structure 375 filling the separation trench 365. Therefore, substrates 300d on which the third semiconductor process has been performed may be formed.

The gap-fill insulating layer 355 may be formed of silicon oxide, for example.

The pad layer 360 may be formed of polysilicon, for example.

The gate electrodes 370 may be formed of a conductive material including at least one of doped polysilicon, metal nitride, a metal-semiconductor compound, or a metal, for example.

The substrates 300d may be formed as semiconductor chips or semiconductor packages by performing a wiring process and a package process. For example, the substrates 300d may be formed as memory chips or memory packages such as a NAND flash memory or the like. The semiconductor chips or semiconductor packages formed using the substrates 300d, described above, may be used as components in an electronic device or an electronic system using a semiconductor. The semiconductor chips or semiconductor packages may be referred to as semiconductor devices.

In the above-described embodiments, the first gas supply unit 9a may inject a high flow rate gas toward a plurality of substrates in the processing chamber 6 (refer to FIGS. 1, 8A, and 8B) in the substrate processing apparatus. In addition, the second gas supply unit 9b may inject a low flow rate gas toward a plurality of substrates in the processing chamber 6 (refer to FIGS. 1, 8A, and 8B) in the substrate processing apparatus. For example, the second gas supply unit 9b may have a simpler structure than the first gas supply unit 9a, and may supply a low flow rate gas into the processing chamber 6 (refer to FIGS. 1, 8A, and 8B) without leakage of the gas, and the first gas supply unit 9a may supply a high flow rate gas into the processing chamber 6 (refer to FIGS. 1, 8A, and 8B) in the substrate processing apparatus without leakage of the gas. In the first gas supply unit 9a, the first adapter 25 and the first fastening region 20a of the first gas nozzle 20 may supply a corrosive gas having a high flow rate into the processing chamber 6 without leakage of the gas. Therefore, since the corrosive gas having a high flow rate is supplied into the processing chamber 6 without leakage of the gas, using the first gas supply unit 9a, productivity may be improved. Each of the plurality of layers 335 as described with reference to FIG. 11 may be conformally formed using such a substrate processing apparatus. As such, the process of conformally forming each of the plurality of layers 335 may be an atomic layer deposition process.

According to embodiments of the inventive concept, it is possible to provide a batch type substrate processing apparatus for simultaneously performing an atomic layer deposition process using a corrosive gas on a plurality of substrates. Therefore, since the atomic layer deposition process may be simultaneously performed on a plurality of substrates, productivity may be improved.

Various advantages and effects of the present inventive concept are not limited to the above, and will be more easily understood in the process of describing specific embodiments of the present inventive concept.

While example embodiments have been illustrated and described above, it will be apparent to those skilled in the art that modifications and variations could be made without departing from the scope of the present invention as defined by the appended claims.

What is claimed is:

1. A substrate processing apparatus comprising:
   a processing chamber;
   a boat configured to stack a plurality of substrates spaced apart from each other in a vertical direction, and to move into the processing chamber by vertical driving;
   a gas nozzle including a nozzle region disposed in the processing chamber, the nozzle region including gas injection holes disposed in a portion of the gas nozzle facing toward the center of the processing chamber and toward where the boat is configured to be located, and a fastening region disposed below the nozzle region;
   a gas inlet including an insertion portion inserted into a gas passage in the fastening region; and
   an adapter coupling the gas inlet and the gas nozzle,
   wherein the fastening region comprises:
      a first lower region; and
      a second lower region disposed on the first lower region and having a protruding portion protruding outwardly from an outer side surface of the first lower region,
   wherein the adapter comprises:
      a lower pedestal;
      a lower fastening portion disposed on the lower pedestal and contacting at least a lower surface of the protruding portion;
      a gasket disposed between a portion of the lower pedestal and a portion of the lower fastening portion;
      an upper fastening portion contacting at least an upper surface of the protruding portion;
      a hole passing through the lower pedestal, the lower fastening portion, the protruding portion, and the upper fastening portion; and
      a fastening unit coupling the lower pedestal, the lower fastening portion, the protruding portion, and the upper fastening portion through the hole.

2. The substrate processing apparatus of claim 1, wherein the lower pedestal comprises a first pedestal and a second pedestal,
   wherein the first pedestal comprises a pedestal platform coupled to the gas inlet, and an extension portion extending upwardly from the pedestal platform to define a cavity,
   the second pedestal is disposed on the extension portion and protrudes outwardly from the first pedestal,
   the second pedestal comprises a first groove recessed in an upper surface thereof,
   the lower fastening portion comprises an upper surface contacting a lower surface of the protruding portion, a lower surface opposite to the upper surface of the lower fastening portion, and a second groove recessed in the lower surface of the lower fastening portion, and
   the gasket fills a space between the first groove and the second groove and contacts the second pedestal and the lower fastening portion.

3. The substrate processing apparatus of claim 2, wherein at least a portion of the gasket has a recess shape.

4. The substrate processing apparatus of claim 1, wherein the gasket has a ring shape, and the gasket has an inner side surface, an outer side surface, an upper surface, and a lower surface, and
   wherein the upper surface of the gasket comprises at least one upper recess, and the lower surface of the gasket comprises at least one lower recess.

5. The substrate processing apparatus of claim 4, wherein the at least one upper recess has a "V" shape, and the at least one lower recess is mirror symmetric with the at least one upper recess.

6. The substrate processing apparatus of claim 4, wherein the at least one upper recess has a "U" shape, and the at least one lower recess is mirror symmetric with the at least one upper recess.

7. The substrate processing apparatus of claim 4, wherein:
   a maximum horizontal width of the at least one upper recess is about 0.65 mm to about 1 mm,
   a horizontal distance from an upper end of the inner side surface to the at least one upper recess is about 0.3 mm to about 0.5 mm,
   a horizontal distance from an upper end of the outer side surface to the at least one upper recess is about 0.3 mm to about 0.5 mm, and a minimum distance between the at least one upper recess and the at least one lower recess is about 0.5 mm to about 0.8 mm.

8. The substrate processing apparatus of claim 1, wherein the upper fastening portion comprises a first upper fastening portion contacting the upper surface of the protruding portion, and a second upper fastening portion extending from the first upper fastening portion and contacting a portion of a side surface of the protruding portion.

9. The substrate processing apparatus of claim 1, wherein, at a height level at which the gasket is located, a distance between the gasket and the gas inlet is shorter than a distance between the fastening unit and the gas inlet.

10. The substrate processing apparatus of claim 1, wherein the gas nozzle comprises a quartz material, and the adapter comprises at least one corrosion-resistant metal alloy.

11. The substrate processing apparatus of claim 1, wherein the gasket comprises a material softer than a material of the lower pedestal and having a higher ductility and smaller hardness than a material of the lower fastening portion.

12. The substrate processing apparatus of claim 1, wherein the fastening region of the gas nozzle further comprises an upper region on the second lower region,
   wherein the upper region comprises a first upper region and a second upper region on the first upper region,
   wherein the first upper region has a substantially vertical outer side surface,
   wherein the second upper region has an inclined outer side surface extending from the outer side surface of the first upper region to gradually decrease in width, and
   wherein the protruding portion of the second lower region of the gas nozzle protrudes outwardly from the outer side surface of the first upper region.

13. The substrate processing apparatus of claim 1, wherein the fastening unit comprises a rod including a portion inserted into the hole.

14. The substrate processing apparatus of claim 1, wherein: when viewed in a plan view, the gasket is between the hole and the gas inlet.

* * * * *